(12) United States Patent
Victoria et al.

(10) Patent No.: US 11,431,146 B2
(45) Date of Patent: Aug. 30, 2022

(54) CHIP ON SUBMOUNT MODULE

(71) Applicant: Jabil Inc., St. Petersburg, FL (US)

(72) Inventors: Lorito E. Victoria, St. Petersburg, FL (US); Lars Runge, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 0 days.

(21) Appl. No.: 14/920,490

(22) Filed: Oct. 22, 2015

(65) Prior Publication Data

US 2016/0285233 A1    Sep. 29, 2016

Related U.S. Application Data

(60) Provisional application No. 62/139,409, filed on Mar. 27, 2015.

(51) Int. Cl.
*H01S 5/02315*    (2021.01)
*H01S 5/023*    (2021.01)
(Continued)

(52) U.S. Cl.
CPC ............ *H01S 5/023* (2021.01); *H01S 5/0233* (2021.01); *H01S 5/0235* (2021.01); *H01S 5/02315* (2021.01); *H01S 5/02345* (2021.01); *H01S 5/02355* (2021.01); *H01S 5/141* (2013.01); *H01S 5/005* (2013.01); *H01S 5/0071* (2013.01); *H01S 5/0231* (2021.01); *H01S 5/0234* (2021.01);
(Continued)

(58) Field of Classification Search
CPC ............ H01S 5/02256; H01S 5/02272; H01S 5/02469; H01S 5/0425; H01S 5/023; H01S 5/02315; H01S 5/0232; H01L 23/49805
See application file for complete search history.

(56) References Cited

U.S. PATENT DOCUMENTS 5,198,886 A * 3/1993 Verspeek ................ H01L 23/13
257/692
5,750,417 A * 5/1998 Nellissen ............ H01L 21/4846
250/492.22
(Continued)

FOREIGN PATENT DOCUMENTS

CN         103178193 A      6/2013
DE      102013201931 A1     8/2014
(Continued)

*Primary Examiner* — Tod T Van Roy
(74) *Attorney, Agent, or Firm* — Young Basile Hanlon & MacFarlane, P.C.

(57) ABSTRACT

A chip on submodule includes a submount having a top surface, bottom surface and side surfaces. A positive electrode plate is affixed to a first portion of one side surface, the top surface and a first portion of the bottom surface. The positive electrode plated first portion of the one side surface and the top surface are interconnected. A connector electrically connects the positive electrode plated top surface to the first portion of the bottom surface. A negative electrode plate is affixed to a second portion of the one side surface and a second portion of the bottom surface. The negative electrode plated second portion of the one side surface and second portion of the bottom surface are interconnected. A laser diode is affixed to the positive electrode plated first portion of the one side surface and connected to the negative electrode plated second portion of the one side surface.

17 Claims, 16 Drawing Sheets

(51) Int. Cl.
  *H01S 5/02345* (2021.01)
  *H01S 5/0233* (2021.01)
  *H01S 5/0235* (2021.01)
  *H01S 5/02355* (2021.01)
  *H01S 5/14* (2006.01)
  *H01S 5/024* (2006.01)
  *H01S 5/02216* (2021.01)
  *H01S 5/00* (2006.01)
  *H01S 5/0231* (2021.01)
  *H01S 5/0234* (2021.01)
  *H01S 5/02253* (2021.01)

(52) U.S. Cl.
  CPC ....... *H01S 5/02216* (2013.01); *H01S 5/02253* (2021.01); *H01S 5/02469* (2013.01)

(56) References Cited

U.S. PATENT DOCUMENTS

| | | |
|---|---|---|
| 5,844,257 A | 12/1998 | Chen |
| 2003/0099444 A1 | 5/2003 | Kim et al. |
| 2003/0231674 A1 | 12/2003 | Kaneko et al. |
| 2006/0072883 A1 | 4/2006 | Kilian et al. |
| 2007/0284708 A1* | 12/2007 | Hanya .................. H01L 33/62 257/676 |
| 2007/0289764 A1* | 12/2007 | Douma ................ G02B 6/4201 174/32 |
| 2009/0294789 A1* | 12/2009 | Yoshida ............. H01S 5/02216 257/98 |
| 2009/0310635 A1* | 12/2009 | Chen .................... H01S 5/0687 372/32 |
| 2013/0322068 A1* | 12/2013 | Clark .................... H01L 33/58 362/235 |
| 2014/0218892 A1* | 8/2014 | Edwards ................ F21K 9/232 362/84 |
| 2015/0318664 A1* | 11/2015 | Eckert ................ H01S 5/02208 372/44.01 |

FOREIGN PATENT DOCUMENTS

| | | |
|---|---|---|
| JP | H0497581 A | 3/1992 |
| JP | 6-188516 A | 7/1994 |
| JP | 2006-066739 A | 3/2006 |
| KR | 10-1192183 B1 | 10/2012 |

* cited by examiner

FIGURE 6A
FIGURE 6B
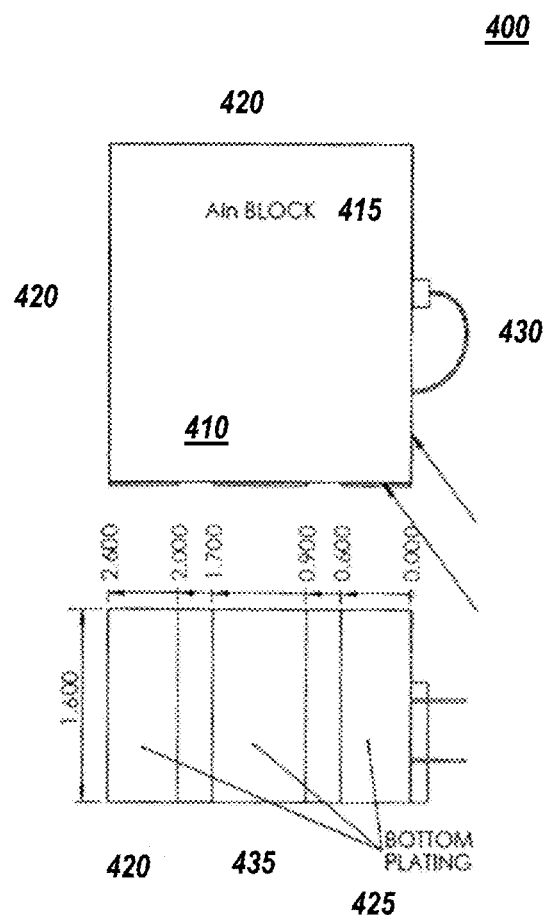
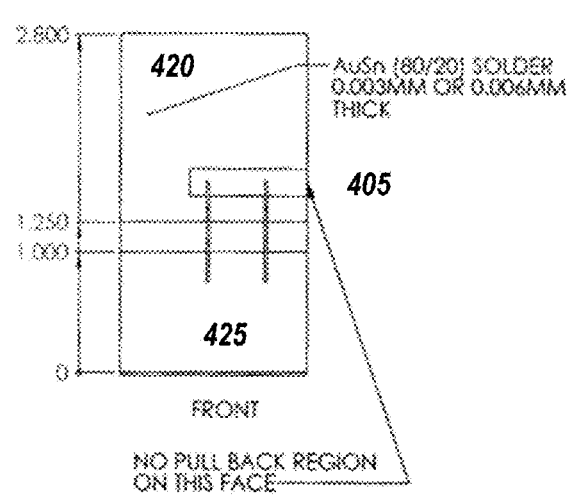
FIGURE 6C

POS. ELECTRODE
CONDUCTIVE
FILM 720

NEG. ELECTRODE
CONDUCTIVE
FILM 725

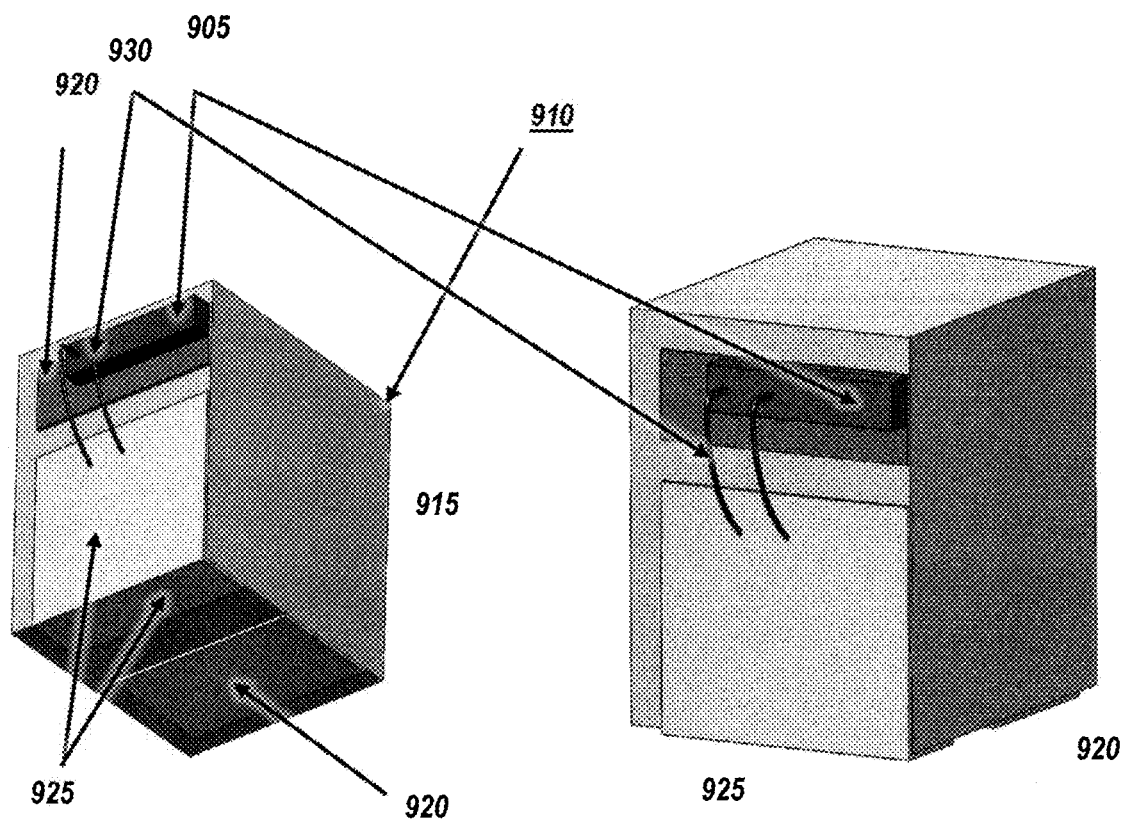
FIGURE 9A
FIGURE 9B
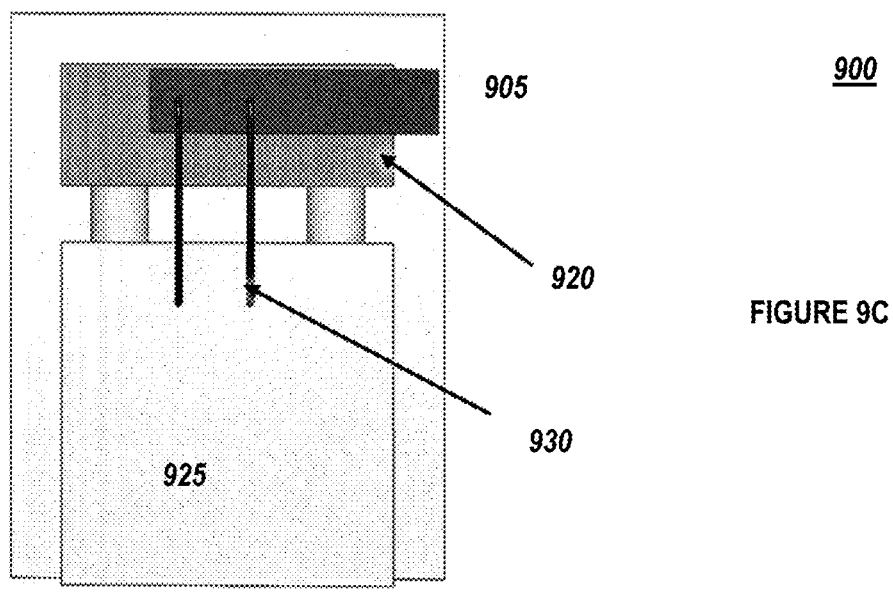
FIGURE 9C

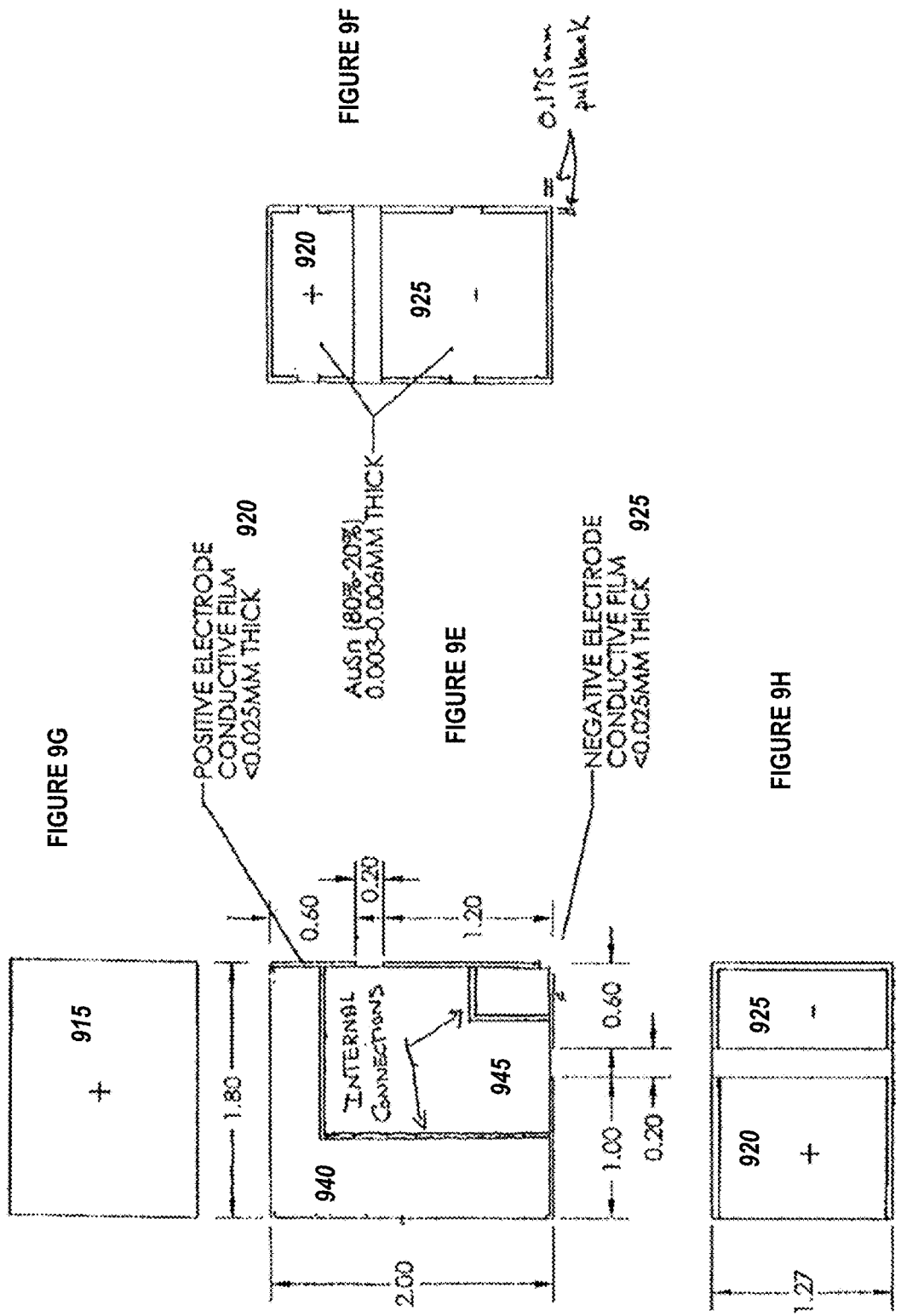

CHIP ON SUBMOUNT MODULE

CROSS REFERENCE TO RELATED APPLICATION

This application claims the benefit of U.S. Provisional Application No. 62/139,409, filed Mar. 27, 2015, which is incorporated by reference as if fully set forth.

FIELD OF INVENTION

The present invention relates generally to an apparatus, system and method for a chip on submount module.

BACKGROUND

Laser scanning devices illuminate or irradiate objects or environments to collect three-dimensional (3D) data and create a 3D model. This 3D data may be used in the production of movies and video games, industrial design, orthotics and prosthetics, reverse engineering and prototyping, quality control/inspection, documentation of cultural artifacts, laser engraving, barcode scanners, and other like applications.

Laser scanning devices use laser projection modules, which include for example lenses, prisms and a laser diode. These laser diodes nominally use material systems that are fragile and subject to mechanical and thermal stress. Consequently, some type of laser packaging is usually required to protect the laser diode and importantly, dissipate heat generated during operation. This is nominally done by using submounts and heatsinks.

Some of the issues with conventional submount designs are that it is expensive and requires a complicated printed circuit board assembly (PCBA) and interconnection that requires custom-designed fixtures, tools and equipment. As such, conventional submount designs have excessively long cycle times with a complicated process flow, and are not conducive to full automation. Therefore, the need exists for an apparatus, system and method of efficiently and simply configuring submount designs for simplified fabrication that may be fully automated.

SUMMARY

A chip on submodule (CoS) including a submount having a top surface, a bottom surface and a plurality of side surfaces. A positive electrode plate is affixed to a first portion of one side surface, the top surface and a first portion of the bottom surface. The positive electrode plated first portion of the one side surface and the positive electrode plated top surface are interconnected. A connector is configured to electrically connect the positive electrode plated top surface to the positive electrode plated first portion of the bottom surface. A negative electrode plate is affixed to a second portion of the one side surface and a second portion of the bottom surface. The negative electrode plated second portion of the one side surface and the negative electrode plated second portion of the bottom surface are interconnected. An optical component is affixed to the positive electrode plated first portion of the one side surface and connected to the negative electrode plated second portion of the one side surface. In an embodiment, the optical component is a laser diode and the CoS is a laser diode module.

BRIEF DESCRIPTION OF THE DRAWINGS

A more detailed understanding may be had from the following description, given by way of example in conjunction with the accompanying drawings wherein:

FIG. 6A is an example side view of the CoS of FIG. 4;
FIG. 6B is an example front view of the CoS of FIG. 4;
FIG. 6C is an example bottom view of the CoS of FIG. 4;
FIG. 9A is an example perspective view of a CoS with vias in accordance with an embodiment;
FIG. 9B is another example perspective view of the CoS of FIG. 9A;
FIG. 9C is an example front view of the CoS of FIG. 9A;
FIG. 9E is an example side view of the CoS of FIG. 9A;
FIG. 9F is an example front view of the CoS of FIG. 9A;
FIG. 9G is an example top view of the CoS of FIG. 9A;
FIG. 9H is an example bottom view of the CoS of FIG. 9A in a laser submodule.

DETAILED DESCRIPTION OF THE PREFERRED EMBODIMENTS

Figure 1:
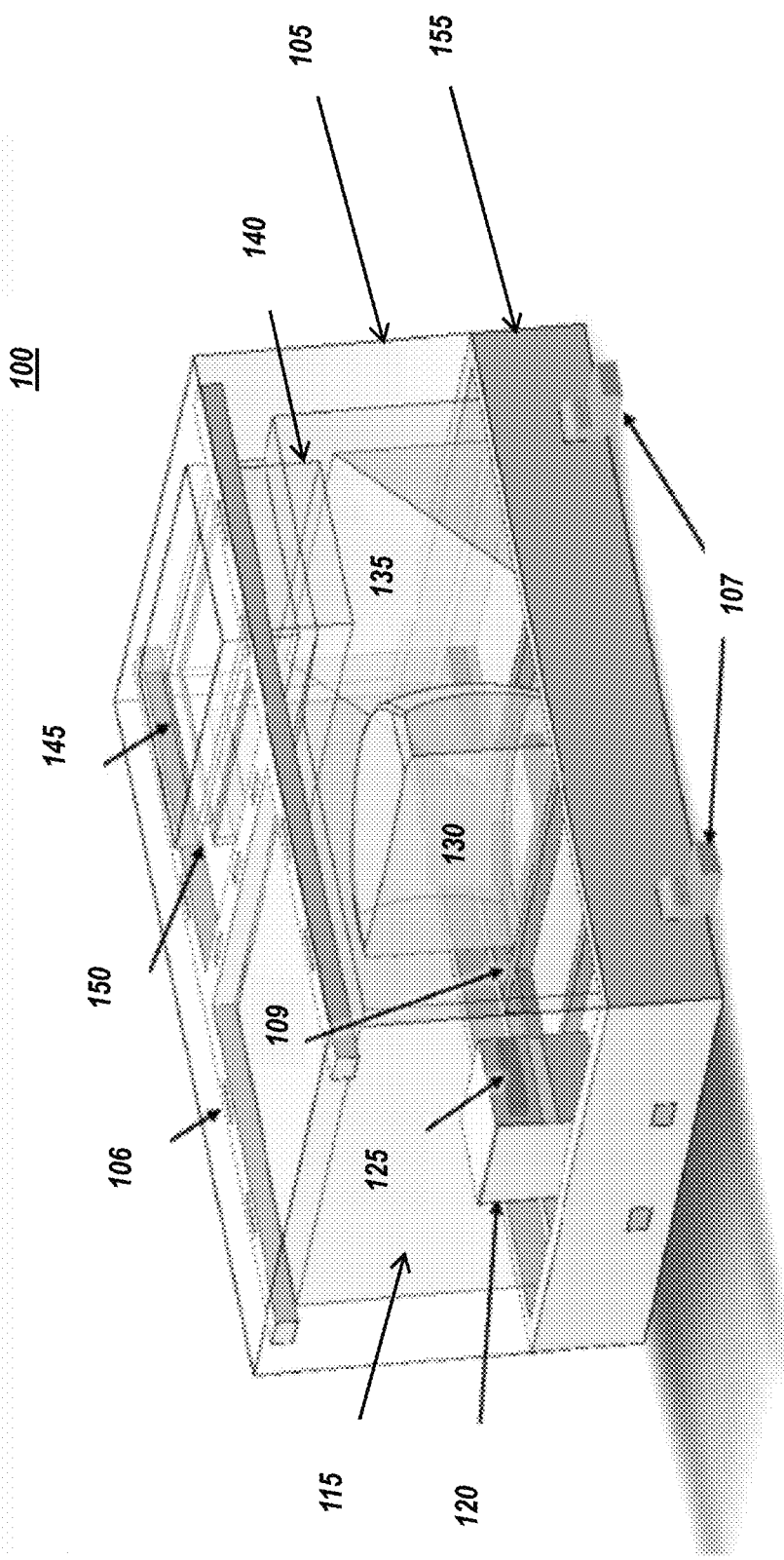
FIG. 1 is an example three-dimensional perspective view of an assembled laser projection module in accordance with an embodiment.

It is to be understood that the figures and descriptions of embodiments of a chip on submount (CoS) module have been simplified to illustrate elements that are relevant for a clear understanding, while eliminating, for the purpose of clarity, many other elements found in typical vehicle systems. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to a CoS module. The CoS module may be modified for a variety of applications and uses while remaining within the spirit and scope of the claims. The embodiments and variations described herein, and/or shown in the drawings, are presented by way of example only and are not limiting as to the scope and spirit. The descriptions herein, including for example the material systems, may be applicable to all embodiments of the CoS module.

Referring now to the drawings wherein similar reference numerals refer to similar elements across the several views, a CoS module is described. The embodiments described herein provide a CoS module that may be used in a variety of devices including laser scanning devices. The CoS is for purposes of illustration a laser diode module where an optical component is a laser diode. Other optical components may be used.

The laser diode module embodiments described herein are generally positionable in package designs that have or need height accurate placement and have minimized c-height, (or z-height or height perpendicular to light emission) requirements. For example, the laser diode module described herein may be easily attached and connected to a semiconductor package such as a lead frame, for example. Laser diode module embodiments described herein provide electrical and thermal connectivity to other electrical and optical components, are compatible for passive alignment techniques and test and burn-in on a large scale. For example, fiducials provided and/or enabled by the laser diode module are open, visible and easy to detect with a vision system. This enables passive alignment of the laser diode module to the other components, such as electrical and optical components, in the optical path. Moreover, the laser diode module is compatible with process automation, increased capacity and mass production.

In general, the laser diode module embodiments may have electrical and thermal connections having two connection points or pads on a bottom surface of the laser diode module to provide electrical connectivity and in some laser diode module embodiments, a third pad that provides heat dissipation out of the laser diode module. The third pad may also be used as a ground. The use of the bottom surface allows for a dispensing of solder or a conductive adhesive on a horizontal surface in a manner that prevents adhesive or solder drippings, leakage or trickling. The placement of the solder or adhesive on the bottom surface allows for holding, aligning and bonding the laser diode module to a main package by heating up the solder or positioning before the adhesive is cured.

The placement of pads underneath or on the bottom surface of the laser diode module also enables passive alignment. The laser diode module may be designed such that the laser bare die, e.g. the laser diode, is visible from different sites and angles. In particular, the laser diode is not covered or obfuscated by the leadframe and/or other components, for example. This enables using the laser bar edges as fiducials or visibility markers on the laser bar. These markers and/or fiducials provide the ability to align the laser diode module such as within a 1 μm accuracy or better, for example, in a very short time.

As described herein above, the laser diode module may be electrically and thermally connected to a main package, which in turn will transfer the heat and make the required electrical contacts. Therefore in certain embodiments, flex cables and/or connector may be omitted. The main package can be, for example, a leadframe or an insert molded part, where the leads or inserts will be conductive materials like copper. These leads or inserts may be placed on solder pads directly on a printed circuit board (PCB). Such laser diode module embodiments eliminate the gold wirebonding process for PCB connectivity, thereby improving cycle time and cutting equipment cost, for example.

The placement of the pads underneath or on the bottom surface of the laser diode module, e.g., having the connection pads on one side, facilitates test and burn in. To burn in the laser diode module in high volumes, the laser diode module may need to be placed in a rack in a manner such that multiple lasers emit in a common direction. Such a rack that may support hundreds of laser diode modules in one row and connect them as one with pogo pins, for example. This can be more easily accomplished by having connection pads that are not on the same side of the laser diode module as the laser bar.

In general, as described herein below, multiple laser diode module embodiments that meet electrical and thermal connectivity requirements, provide for passive alignment and provide for test and burn in on a large scale may be provided. For example, as shown herein below, the plated surfaces may have an L-shape, a quarter-shape or use a wrap-around design. Moreover, vias may be used to connect a laser diode or bar to the bottom plating or pads. Consequently, the laser diode module and plating is very flexible for laser diode attach positioning and calibration. As a result, a universal fixture may be used to handle several processes including laser diode attachment, wirebonding and burn-in.

Although the laser diode module embodiments described herein are discussed with reference to a laser projection module, the laser diode module embodiments may also be used in cellular devices, laptops, notebooks, tablets and other similar devices, all by way of non-limiting example.

Figure 2:
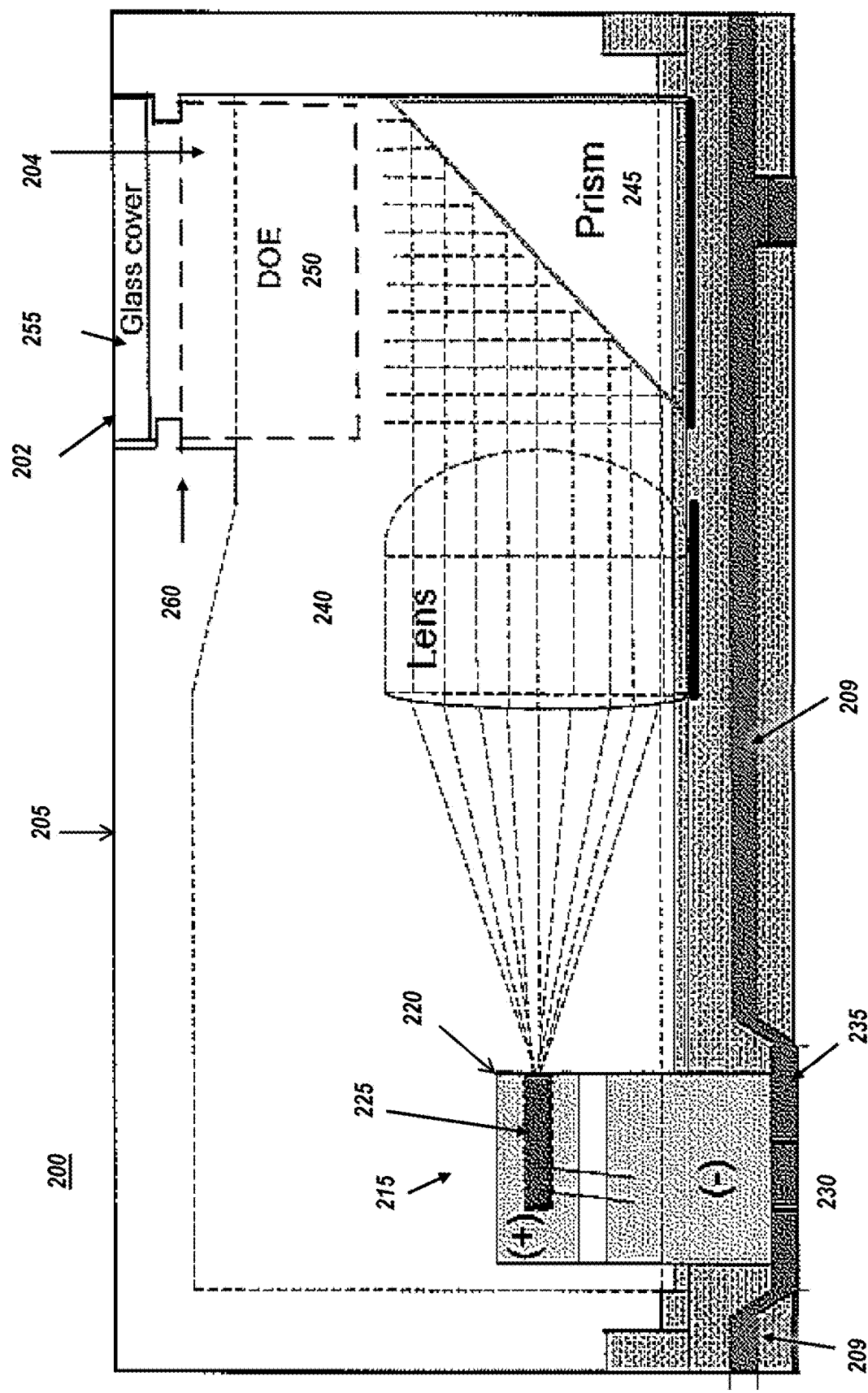
FIG. 2 is an example side view of a laser projection module utilizing a laser diode module, (which is a chip on submount (CoS) module), together with a prism configuration in accordance with an embodiment.

FIG. 1 is a three-dimensional perspective view of a laser projection module 100 in accordance with an embodiment. Laser projection module 100 may include a cover 105, a cover lead frame 106 for securing the cover 105 and a lead frame having an outer lead frame portion 107 that is configured outside of the cover 105, and an inner lead frame portion 109 that is configured inside the cover 105. In an embodiment, the outer lead frame portion 107 and inner lead frame portion 109 may include a copper lead frame with nickel-palladium-gold (NiPdAu) plating, for example. Inner lead frame portion 109 may be configured as a meandering frame that has a frame portion coupled to a CoS, for example a laser diode module 115. Laser diode module 115 may include a plated submount 120 and a laser diode 125. In an embodiment, the laser diode module 115 may be affixed to a die attach pad (DAP) portion (as shown in FIG. 2) of the inner lead frame portion 109, for example.

Laser diode 125 and plated submount 120 may be electrically connected via wirebonding (not shown) to the inner lead frame portion 109 and may be coupled/affixed/mounted, (e.g., surface mounted, adhesive and/or other attachments mechanisms known to one of ordinary skill in the art), to the laser projection module 100.

A lens 130 may be coupled/affixed to the laser projection module 100 via an adhesive such as, but not limited to, low-temperature glue, snap-cure glue, and/or UV cure glue. Other attachment mechanisms known to one of ordinary skill in the art may also be used. Lens 130 may be configured to pass light emissions from the laser diode 125 to prism 135, which in turn reflects light through diffractive optical element 140 and optical cover 145 to a region outside the laser projection module 100. The diffractive optical element 140 and optical cover 145 may be coupled/affixed to the cover 105, which in turn may be coupled/affixed to a cover base 155.

The diffractive optical element 140 may be spaced from the optical cover 145, where the space may be defined by a cover ledge 150 that separates the two elements, where the diffractive optical element 140 may be adhered to a bottom portion of the cover ledge 150, while the optical cover 145 may be seated and coupled to a top portion of the cover ledge 150. In an embodiment, the optical cover 145 and/or lens 130 may comprise an optical material like glass. In other illustrative embodiments, the optical cover 145 may comprise a plastic or polymer material and may further include suitable optical coatings, depending on the application. The diffractive optical element 140 may be configured as thin phase elements that operate by means of interference and diffraction to produce patterned or arbitrary distributions of light from prism 135 and may be configured with binary or analog phase profiles. Diffractive optical element 140 may include, but is not limited to, diffractive lenses, beam splitters (spot arrays), diffractive diffusers, and corrector plates. Diffractive lenses may be used to reduce the number of elements in conventional lens systems and mitigate the use of exotic materials in correcting chromatic aberrations, for example. Diffractive lenses may be configured as very thin elements with total depth height equal to $\lambda/(n-1)$, where $\lambda$ is the operating wavelength and n is the index of refraction. A diffractive lens may be composed of a series of zones that become finer towards the edge of the lens.

In certain embodiments, prism 135 may be configured as a transparent optical element with flat, polished surfaces that refract light. At least two of the flat surfaces of prism 135 may have an angle between them, and may include a geometrical shape such as a triangular prism with a triangular base and rectangular sides. Prism 135 may be made from any material that is transparent to the wavelengths for which it is designed, and includes, but is not limited to, glass, plastic and fluorite, for example.

In some illustrative embodiments, the laser projection module 100 may be miniaturized for use in small or portable devices, such as smart phones. In one example, the dimensions (H×L×W) of some of the components may be as follows, where the laser diode 125 has the dimension (0.14×1.0×0.225 mm), and the plated submount 120 has the dimension of (2.80×1.60×2.60 mm), all by way of non-limiting example.

FIG. 2 is a side view of a laser projection module 200 utilizing a submount together with a prism configuration in accordance with an embodiment of the invention. The laser projection module 200 may include a cover 205 and a lead frame having an inner lead frame portion 209 that is configured inside the cover 205. Laser diode module 215, which includes a plated submount 220, and a laser diode 225, may be configured within a cavity 230 of the laser projection module assembly 200. The laser diode module 215 may be adhered to a DAP portion 235, or other suitable portion of lead frame 209. Illuminated light from laser diode 225 may pass through a lens 240 to prism 245, which reflects light through diffractive optical element 250 and optical cover 255 to a region outside the laser projection module assembly 200. Diffractive optical element 250 may be spaced from the optical cover 255 via a cover ledge 260.

Figure 3:
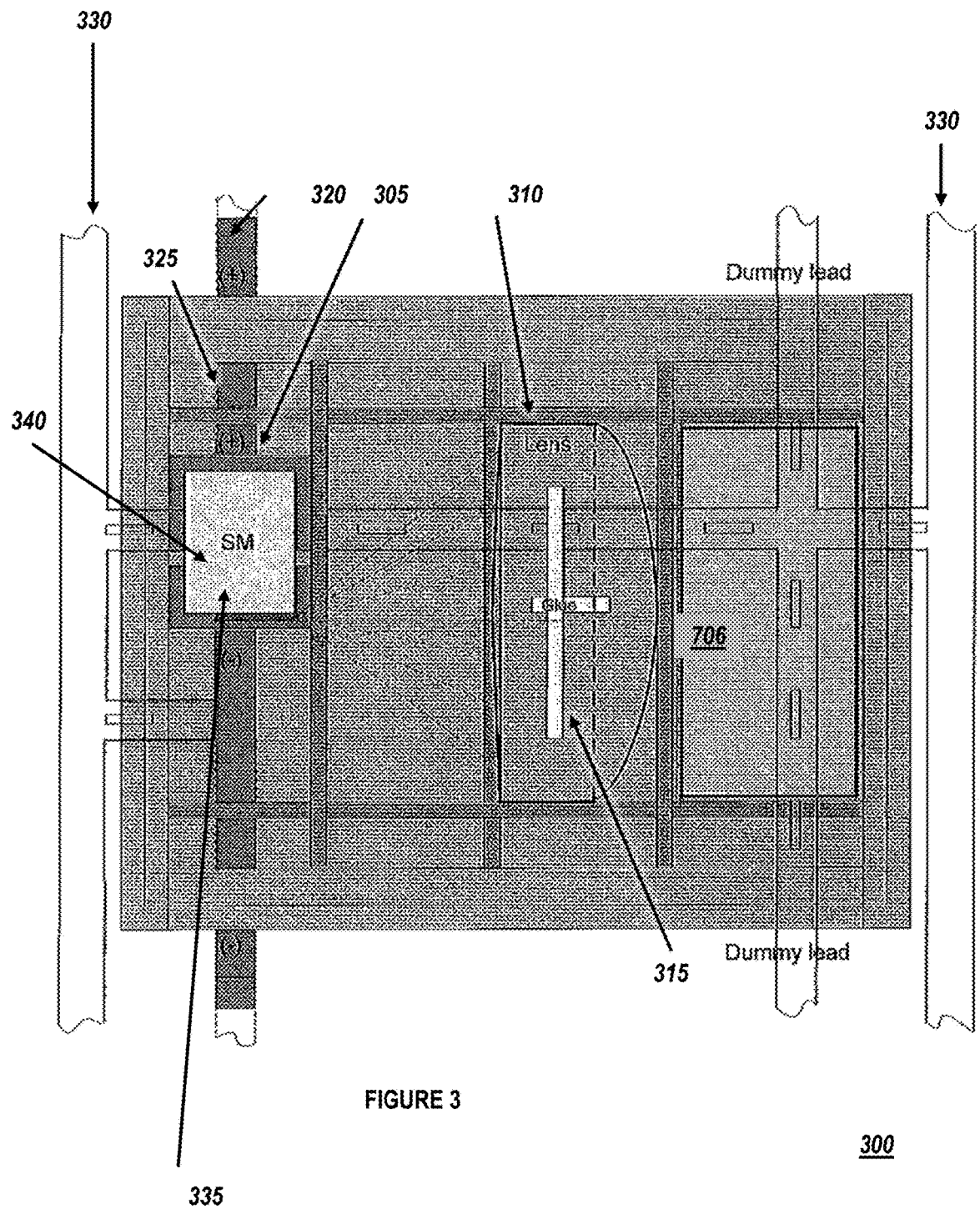
FIG. 3 is an example top view of a laser projection module utilizing a CoS together with a module lead frame and cover lead frame in accordance with an embodiment.

FIG. 3 is an example top view of a laser projection module 300 consistent with the embodiment of FIG. 2 where a laser diode module 305 and a lens 310 may be coupled/affixed in an area 315. Also shown, as described herein above, are an outer lead frame portion 320, an inner lead frame portion 325 and an endrail lead frame 330. The laser diode module 305 includes a laser diode 335 mounted on a plated submount 340. The laser diode module 305 emits light toward the lens 310.

Figure 4:
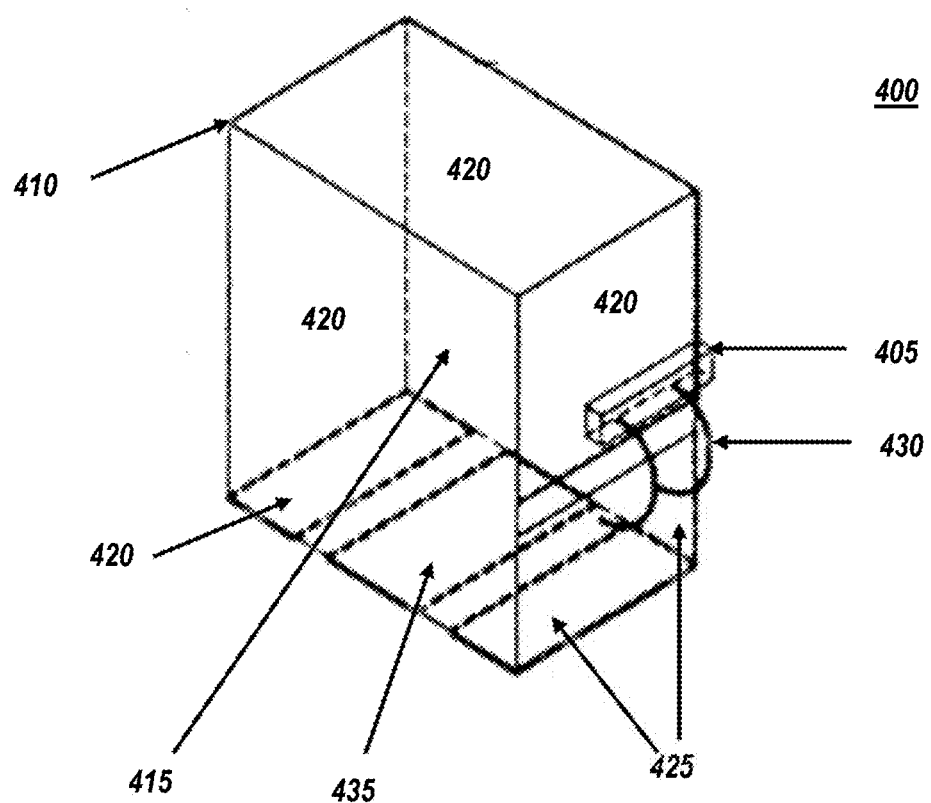
FIG. 4 is an example perspective view of a CoS in accordance with an embodiment.

FIG. 4 is an example perspective view of a laser diode module 400 in accordance with an embodiment of the invention. The laser diode module 400 may include a laser diode 405 affixed to a plated submount 410. The plated submount 410 may include a submount block 415 that may be made from, for example, aluminum nickel (AlNi), aluminum nitride (AlN), alumina, ceramics and other suitable substrate materials. Submount block 415 may be, for example, a rectangular block having a top surface, a bottom surface and a plurality of side surfaces. Other suitable shapes may be used though. In the embodiment of the plated submount 410, a top surface, first side surface, a portion of a second side surface and a portion of a bottom surface of the submount block 415 may be plated or coated with a positive electrode plate or conductive film 420, where the top surface, first side surface, the portion of the second side surface and the portion of the bottom surface are connected. Another portion of the second side surface and another portion of the bottom surface may be plated or coated with a negative electrode plate or conductive film 425, where the another portion of the second side surface and the another portion of the bottom surface are connected. The positive electrode plate or conductive film 420 and negative electrode plate or conductive film 425 may be made from, for example, nickel-gold (NiAu), copper (Cu), nickel (Ni), gold (Au), tin, palladium, titanium and other suitable materials and may be affixed to the submount block 415 using techniques known to one of ordinary skill in the art. In an illustrative embodiment, the conductive film or plate may be less than about 0.025 mm thick.

Laser diode 405 may be connected or coupled to the positive electrode plate or conductive film 425 on the portion of the second side surface using techniques known to one of ordinary skill in the art. In the illustrated embodiment, the laser diode 405 may be vertically mounted with respect to the plated submount 410. For purposes of illustration, a gold-tin (AuSn) solder may be used to affix components such as the laser diode 405 to the positive electrode plate or conductive film 425. The laser diode 405 may be connected or coupled to the negative electrode plate or conductive film 425 on the another portion of the second side surface using wire bonds 430, for example. The laser diode module 400 may further include a thermal pad 435 on another portion of the bottom surface for dissipating heat from the laser diode module 400 to, for example, a heat sink (not shown). In an embodiment, the thermal pad 435 may be part of the leadframe. The thermal pad 435 may be made from NiPd, or copper plated with NiAU or a NiPdAu stack. The laser diode module embodiments described herein may or may not include a thermal pad.

Figure 5A:
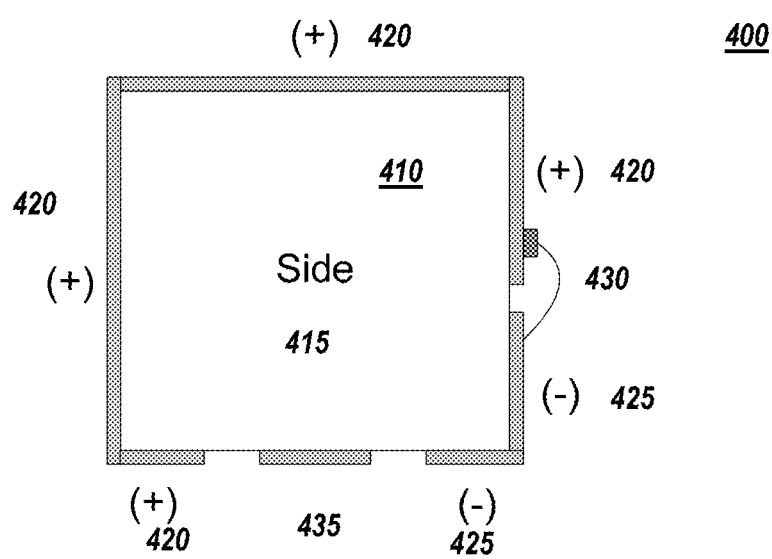
FIG. 5A is an example side view of the CoS of FIG. 4.
Figure 5B:
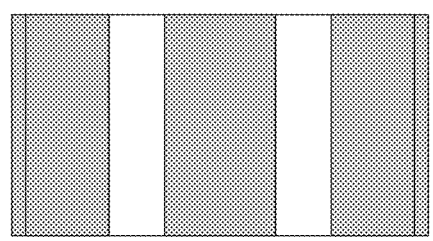
FIG. 5B is an example bottom view of the CoS of FIG. 4.

FIG. 5A is an example side view and FIG. 5B is an example bottom view of the laser diode module 400 of FIG. 4. As described herein above, the laser diode module 400 may include the laser diode 405 affixed to a plated submount 410. The plated submount 410 may include a submount block 415 which may be plated or coated with a positive electrode plate or conductive film 420 and a negative electrode plate or conductive film 425. The laser diode 405 may be connected or coupled to the positive electrode plate or conductive film 425 using techniques known to one of ordinary skill in the art and may be connected or coupled to the negative electrode plate or conductive film 425 using wire bonds. 430. Also shown is the thermal pad 435.

FIG. 6A is another example side view, FIG. 6B is an example front view and FIG. 6C is another example bottom view of the laser diode module 400 of FIG. 4. As described herein above, the laser diode module 400 may include the laser diode 405 affixed to a plated submount 410. The plated submount 410 may include a submount block 415 which may be plated or coated with a positive electrode plate or conductive film 420 and a negative electrode plate or conductive film 425. The laser diode 405 may be connected or coupled to the positive electrode plate or conductive film 420 using techniques known to one of ordinary skill in the art and may be connected or coupled to the negative electrode plate or conductive film 425 using wire bonds 430. Also shown is the thermal pad 435. For purposes of illustration, FIGS. 6A-6C provide example dimensions for the laser diode module 400.

Figure 7A:
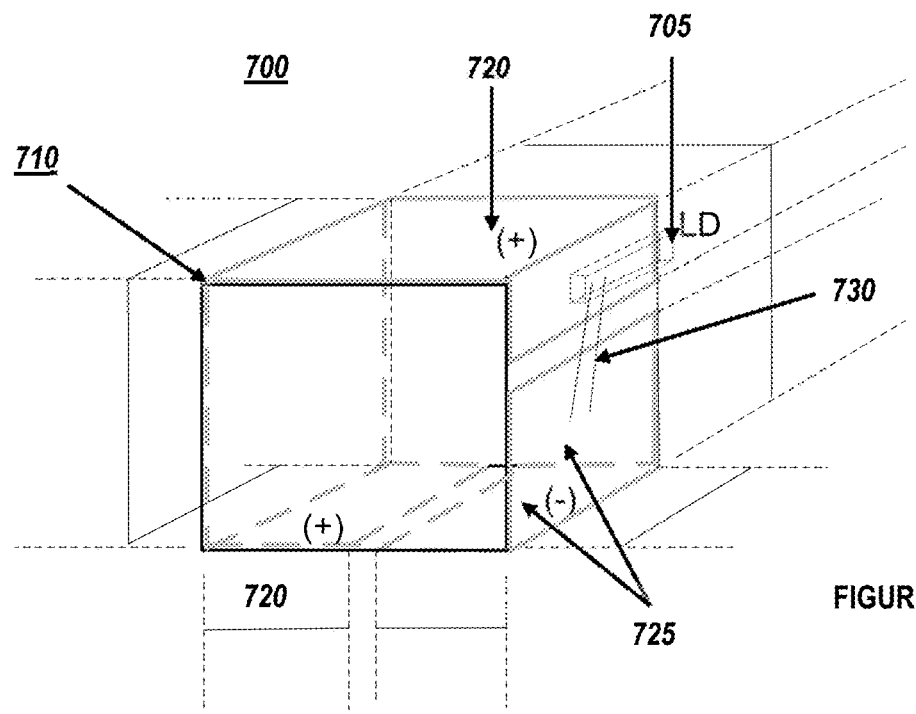
FIG. 7A is an example perspective view of a CoS in accordance with another embodiment.
Figure 7B:
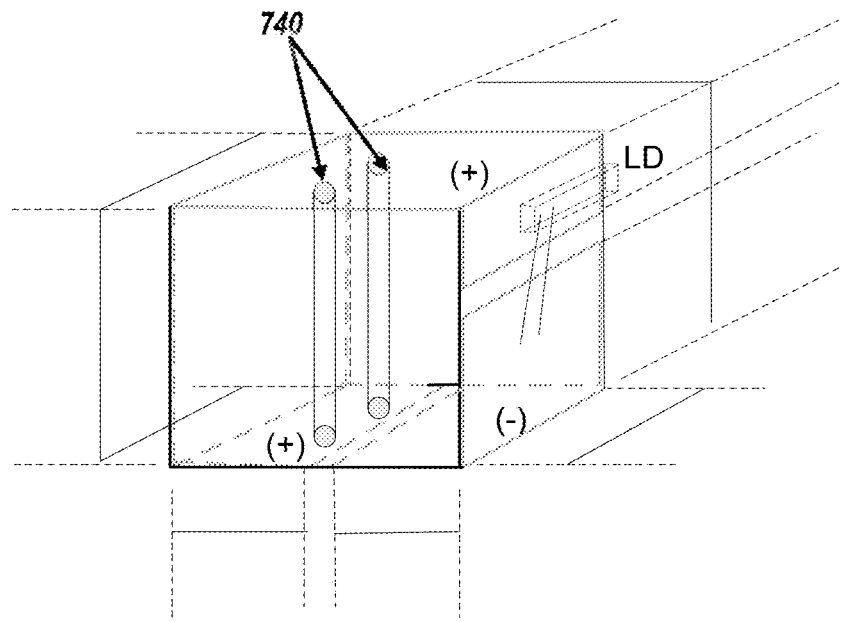
FIG. 7B is an example perspective view of the CoS of FIG. 7A illustrating a via.
Figure 7D:
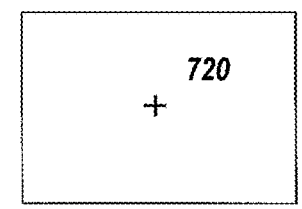
FIG. 7D is an example top view of the CoS of FIG. 7A.
Figure 7C:
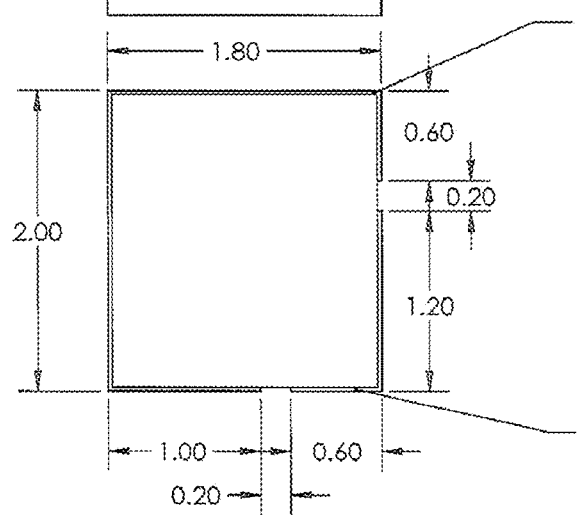
FIG. 7C is an example side view of the CoS of FIG. 7A.
Figure 7E:
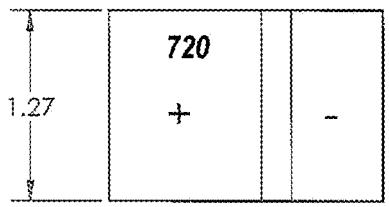
FIG. 7E is an example bottom view of the CoS of FIG. 7A.
Figure 7F:
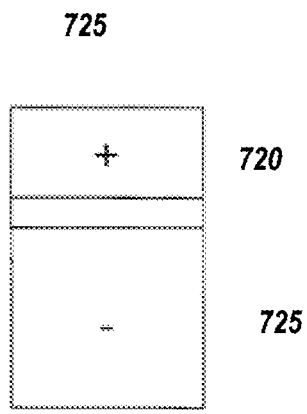
FIG. 7F is an example front view of the CoS of FIG. 7A.

FIGS. 7A and 7B illustrate a laser diode module 700 having a plated submount 710 in accordance with another embodiment of the invention. The laser diode module 700 includes a laser diode 705 that is affixed to the plated submount 710, which includes a submount block 715. A top surface, a portion of a side surface and a portion of a bottom surface of the submount block 715 may be plated or coated with a positive electrode plate or conductive film 720, where the top surface and the portion of a side surface are connected. Another portion of the side surface and another portion of the bottom surface may be plated or coated with a negative electrode plate or conductive film 725, where the another portion of the side surface and the another portion of the bottom surface are connected. Laser diode 705 may be connected or coupled to the positive electrode plate or conductive film 720 on the portion of the side surface using techniques known to one of ordinary skill in the art. The laser diode 705 may be connected or coupled to the negative electrode plate or conductive film 725 on the another portion of the side surface using wire bonds 730. The laser diode module 700 and in particular the plated submount 710 may further include vias 740 to facilitate or provide electrical connectivity between the top and bottom positive electrode plates 720. FIG. 7C is an example side view, FIG. 7D is an example top view, FIG. 7E is an example bottom view and FIG. 7F is an example front view of the laser diode module of FIG. 7A. For purposes of illustration, FIGS. 7C-7F provide example dimensions for the laser diode module 700.

Figure 8A:
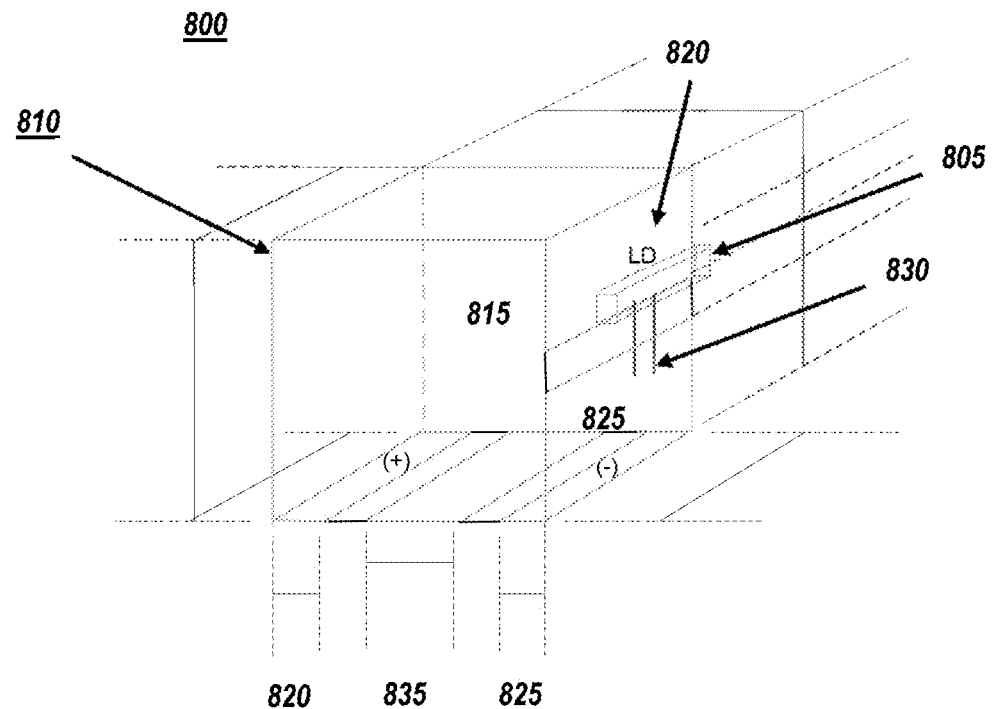
FIG. 8A is an example perspective view of a CoS in accordance with another embodiment.
Figure 8B:
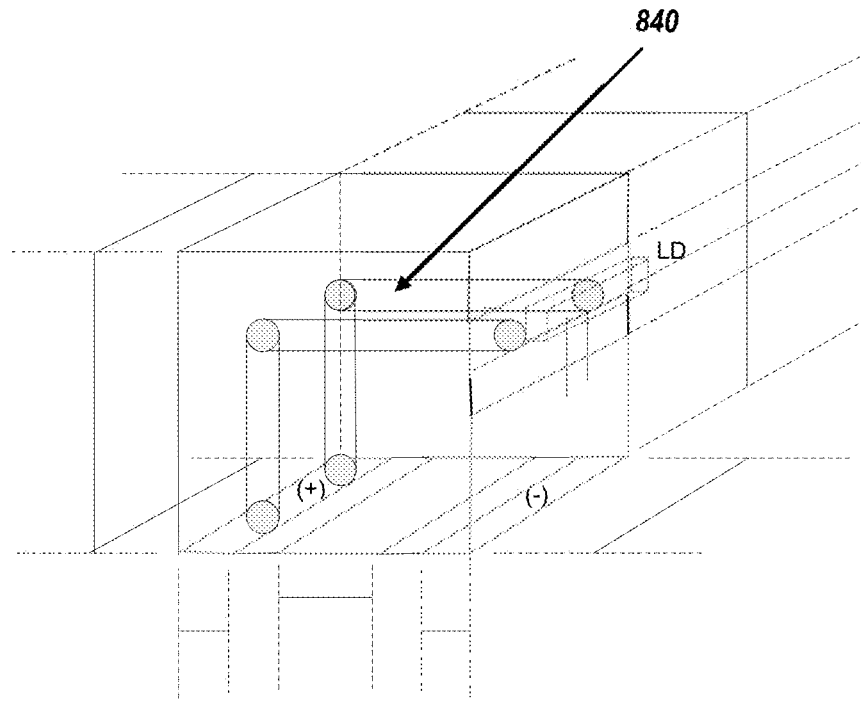
FIG. 8B is example perspective view of the CoS of FIG. 8A illustrating vias.
Figure 9D:
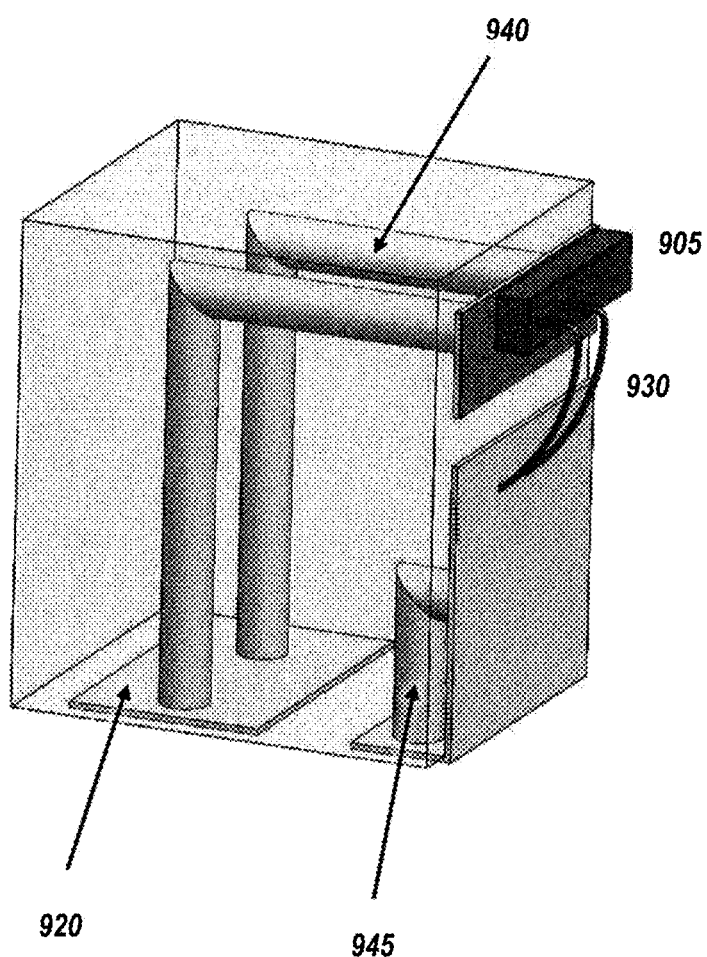
FIG. 9D is another perspective view of the CoS of FIG. 9A.

FIGS. 8A and 8B illustrate a laser diode module 800 having a plated submount 810 in accordance with another embodiment of the invention. The laser diode module 800 may include a laser diode 805 that is affixed to the plated submount 810, which includes a submount block 815. A portion of a side surface and a portion of a bottom surface of the submount block 815 may be plated or coated with a positive electrode plate or conductive film 820. Another portion of the side surface and another portion of the bottom surface may be plated or coated with a negative electrode plate or conductive film 825, where the another portion of the side surface and another portion of the bottom surface are connected. Laser diode 805 may be connected or coupled to the positive electrode plate or conductive film 820 on the portion of the side surface using techniques known to one of ordinary skill in the art. Laser diode 805 may be connected or coupled to the negative electrode plate or conductive film 825 on the another portion of the side surface using wire bonds 830. Laser diode module 800 may further include a thermal pad 835 on another portion of the bottom surface for dissipating heat from the laser diode module 800 to, for example, a heat sink (not shown). Laser diode module 800, and in particular plated submount 810, may further include vias 840 to facilitate or provide electrical connectivity between the side and bottom positive electrode plates 820.

FIGS. 9A-9D illustrate a laser diode module 900 having a plated submount 910 in accordance with an embodiment of the invention. The laser diode module 900 may include a laser diode 905 that is affixed to the plated submount 910, which may include a submount block 915. A portion of a side surface and a portion of a bottom surface of the submount block 915 may be plated or coated with a positive electrode plate or conductive film 920 and another portion of the side surface and another portion of the bottom surface may be plated or coated with a negative electrode plate or conductive film 925. Laser diode 905 may be connected or coupled to the positive electrode plate or conductive film 925 on the portion of the side surface using techniques known to one of ordinary skill in the art. Laser diode 905 may be connected or coupled to the negative electrode plate or conductive film 925 on the another portion of the side surface using wire bonds 930. Laser diode module 900 and in particular the plated submount 910 may further include vias 940 to facilitate or provide electrical connectivity between the side and bottom positive electrode plates 920 and vias 945 to facilitate or provide electrical connectivity between the side and bottom negative electrode plates 925. FIG. 9E is an example cross-sectional side view, FIG. 9F is an example front view, FIG. 9G is an example top view and FIG. 9H is an example bottom view of the laser diode module 900 of FIG. 9A. For purposes of illustration, FIGS. 9C-9F provides example dimensions for the laser diode module 900.

As shown in FIG. 9F, there may be a pullback with respect to the placement of the plating, for example, side positive electrode plate 920 on the submount block 915. That is, the plating should be within a predetermined distance of the edge of the submount block 915. In an embodiment, the pullback may be no more than 10 microns. In another embodiment, the pullback may be about 0.175 mm.

Figure 10:
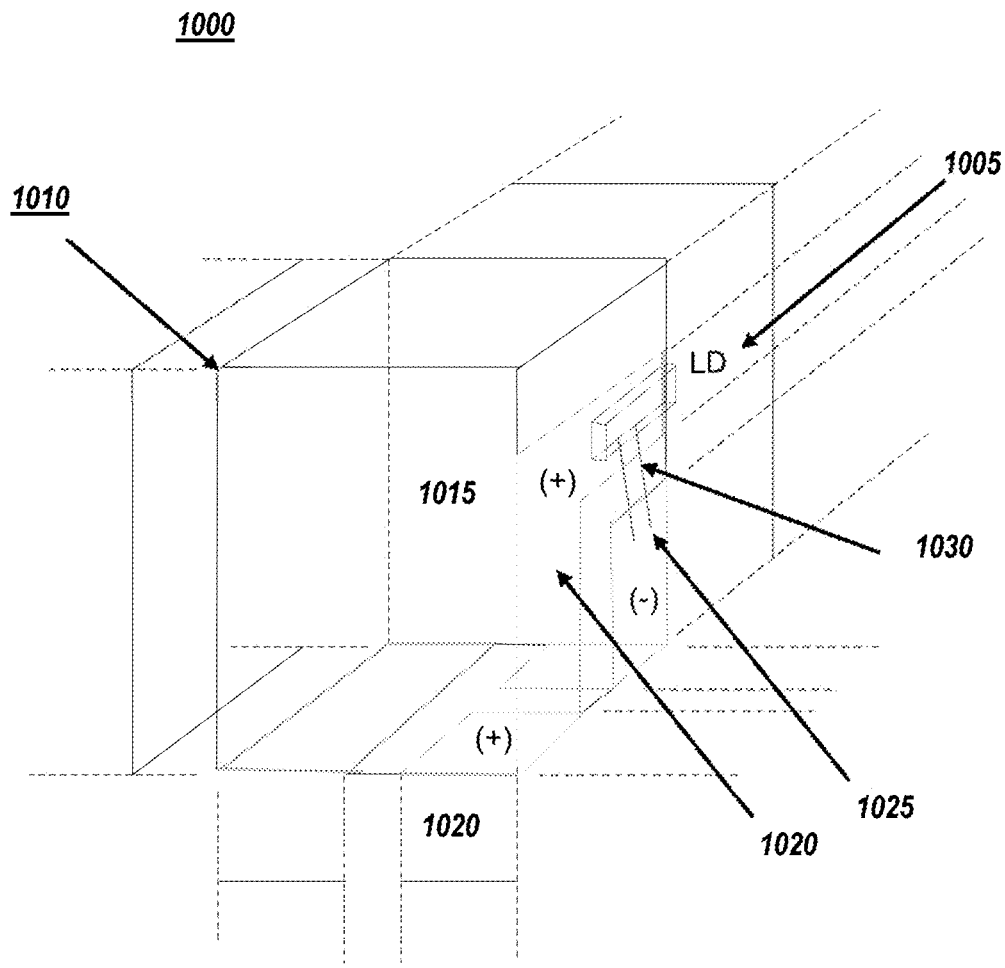
FIG. 10 is an example perspective view of a CoS in accordance with another embodiment.

FIG. 10 is an example perspective view of a laser diode module 1000 having a plated submount 1010 in accordance with an embodiment of the invention. Laser diode module 1000 may include a laser diode 1005 that is affixed to the plated submount 1010, which may include a submount block 1015. A portion of side surface and a portion of a bottom surface of the submount block 1015 may be plated or coated with a positive electrode plate or conductive film 1020, where the portion of side surface and the portion of the bottom surface are connected. Another portion of the side surface and another portion of the bottom surface may be plated or coated with a negative electrode plate or conductive film 1025, where the another portion of the side surface and the another portion of the bottom surface are connected. Laser diode 1005 may be connected or coupled to the positive electrode plate or conductive film 1020 on the portion of the side surface using techniques known to one of ordinary skill in the art. Laser diode 1005 may be connected or coupled to the negative electrode plate or conductive film 1025 on the another portion of the side surface using wire bonds 1030.

Figure 11:
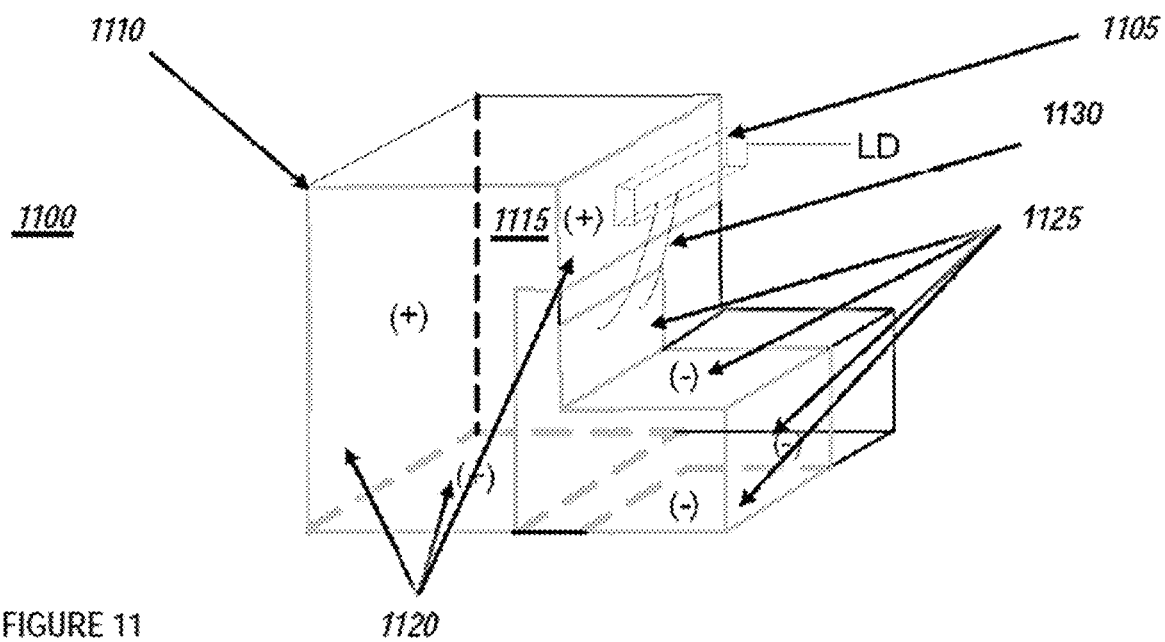
FIG. 11 is an example perspective view of a CoS in accordance with another embodiment.

FIG. 11 is an example perspective view of a laser diode module 1100 having a plated submount 1110 in accordance with an embodiment of the invention. Laser diode module 1100 may include a laser diode 1105 that is affixed to the plated submount 1110, which may include a submount block 1115. A portion of a side surface, a portion of a second side surface and a portion of a bottom surface of the submount block 1115 may be plated or coated with a positive electrode plate or conductive film 1120, where the portion of a side surface, the portion of the second side surface and the portion of the bottom surface are connected. Another portion of the side surface, a portion of a lower top surface, a portion of a third side surface and a portion of the bottom surface may be plated or coated with a negative electrode plate or conductive film 1125, where the another portion of the side surface, the portion of the lower top surface, the portion of the third side surface and the portion of the bottom surface are connected. Laser diode 1105 may be connected or coupled to the positive electrode plate or conductive film 1120 using techniques known to one of ordinary skill in the art. Laser diode 1105 may be connected or coupled to the negative electrode plate or conductive film 1125 using wire bonds 1130.

Figure 12:
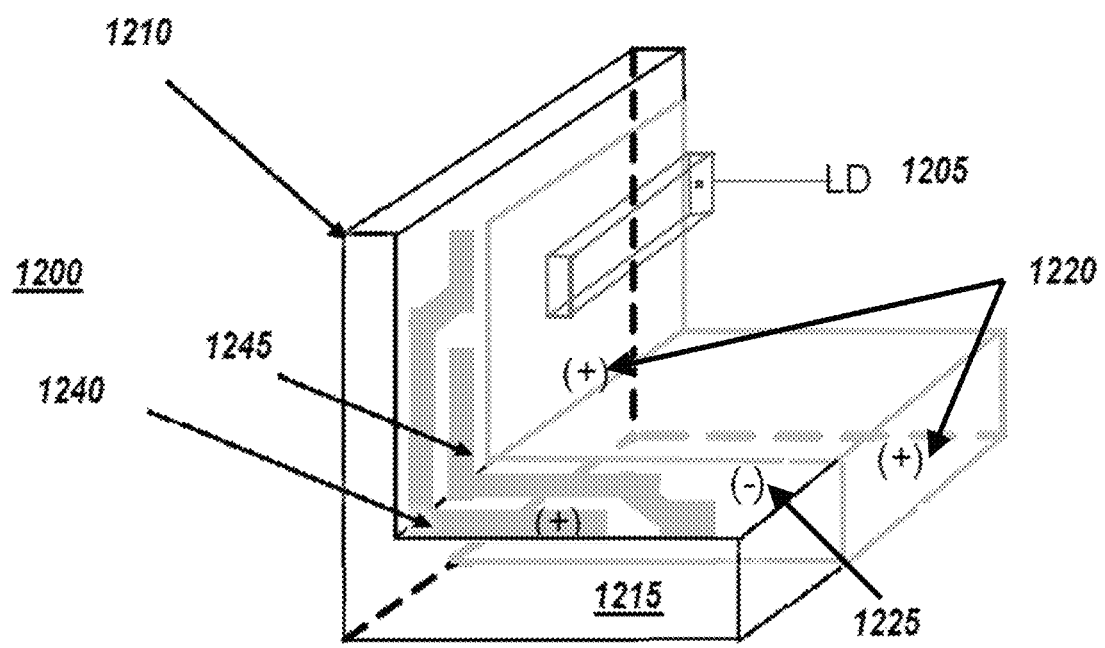
FIG. 12 is an example perspective view of a CoS in accordance with another embodiment.

FIG. 12 is an example perspective view of a laser diode module 1200 having a plated submount 1210 in accordance with an embodiment of the invention. Laser diode module 1200 may include a laser diode 1205 affixed to a CoS module plated submount 1210, which may include a submount block 1215. A portion of a side surface and a portion of a bottom surface of the submount block 1215 may be plated or coated with a positive electrode plate or conductive film 1220. A portion of the bottom surface may be plated or coated with a negative electrode plate or conductive film 1225. Laser diode 1205 may be connected or coupled to the positive electrode plate or conductive film 1220 using techniques known to one of ordinary skill in the art. A trace 1240 may be used to facilitate or provide electrical connectivity between the side and bottom positive electrode plates 1220. Another trace 1245 may be used to facilitate or provide electrical connectivity between the laser diode 1205 and the bottom negative electrode plate or conductive film 1225.

Figure 13:
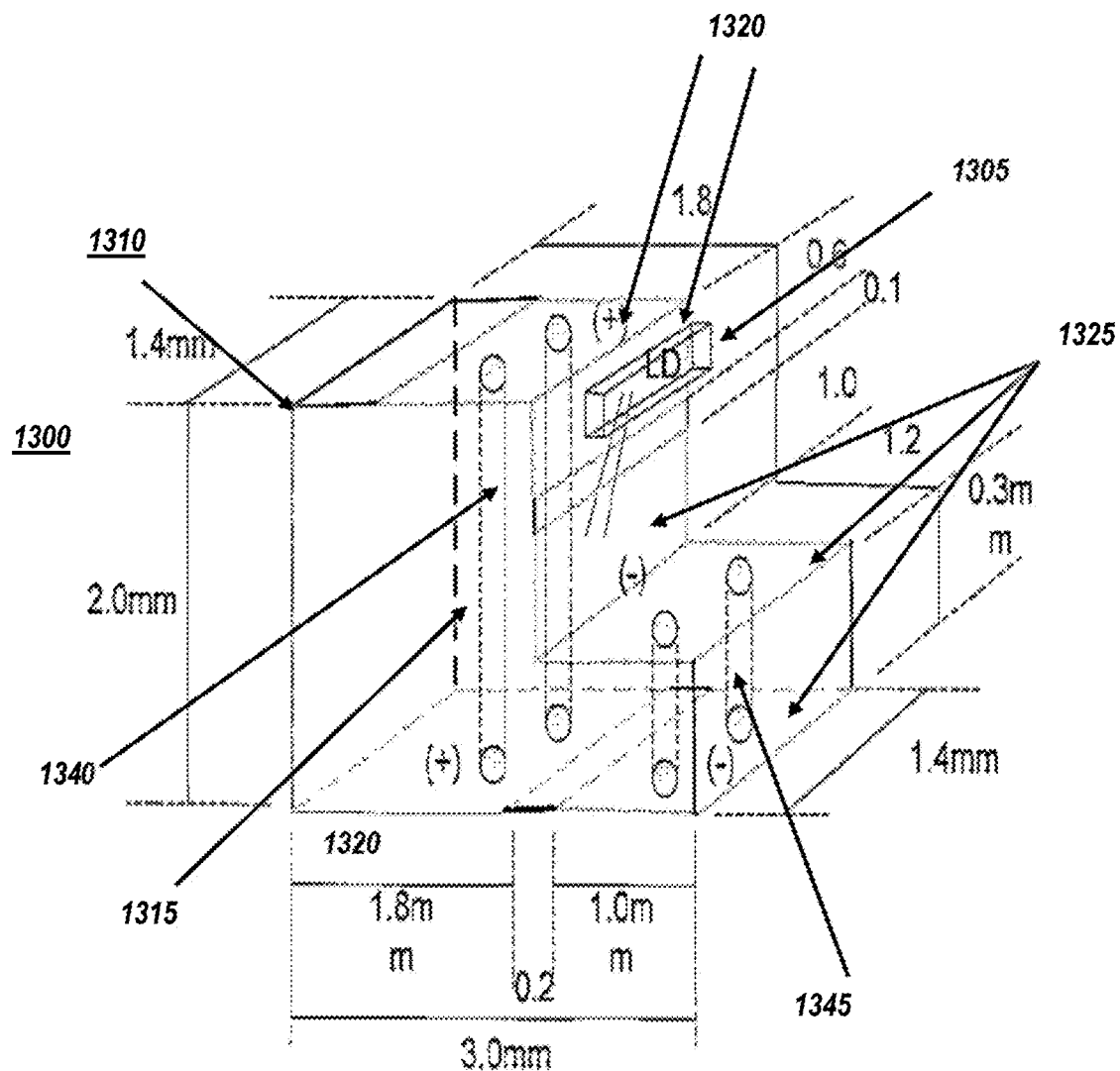
FIG. 13 is an example perspective view of a CoS in accordance with another embodiment.

FIG. 13 is an example perspective view of a laser diode module 1300 having a plated submount 1310 in accordance with an embodiment of the invention. Laser diode module 1300 may include a laser diode 1305 that may be affixed to the plated submount 1310, which may include a submount block 1315. A portion of a higher or first top surface, a portion of a side surface and a portion of a bottom surface of the submount block 1315 may be plated or coated with a positive electrode plate or conductive film 1320, where the higher or first top surface and the portion of a side surface are connected. Another portion of the side surface, a lower or second top surface and another portion of the bottom surface may be plated or coated with a negative electrode plate or conductive film 1325, where the another portion of the side surface and the lower or second top surface are connected. Laser diode 1305 may be connected or coupled to the positive electrode plate or conductive film 1320 on the portion of the side surface using techniques known to one of ordinary skill in the art. Laser diode 1305 may be connected or coupled to the negative electrode plate or conductive film 1325 on the another portion of the side surface using wire bonds 1330. Laser diode module 1300, and in particular the plated submount 1310, may further include vias 1340 to facilitate or provide electrical connectivity between the higher or first top and bottom positive electrode plates 1320 and vias 1345 to facilitate or provide electrical connectivity between the lower or second top and bottom negative electrode plates 1325.

Figure 14:
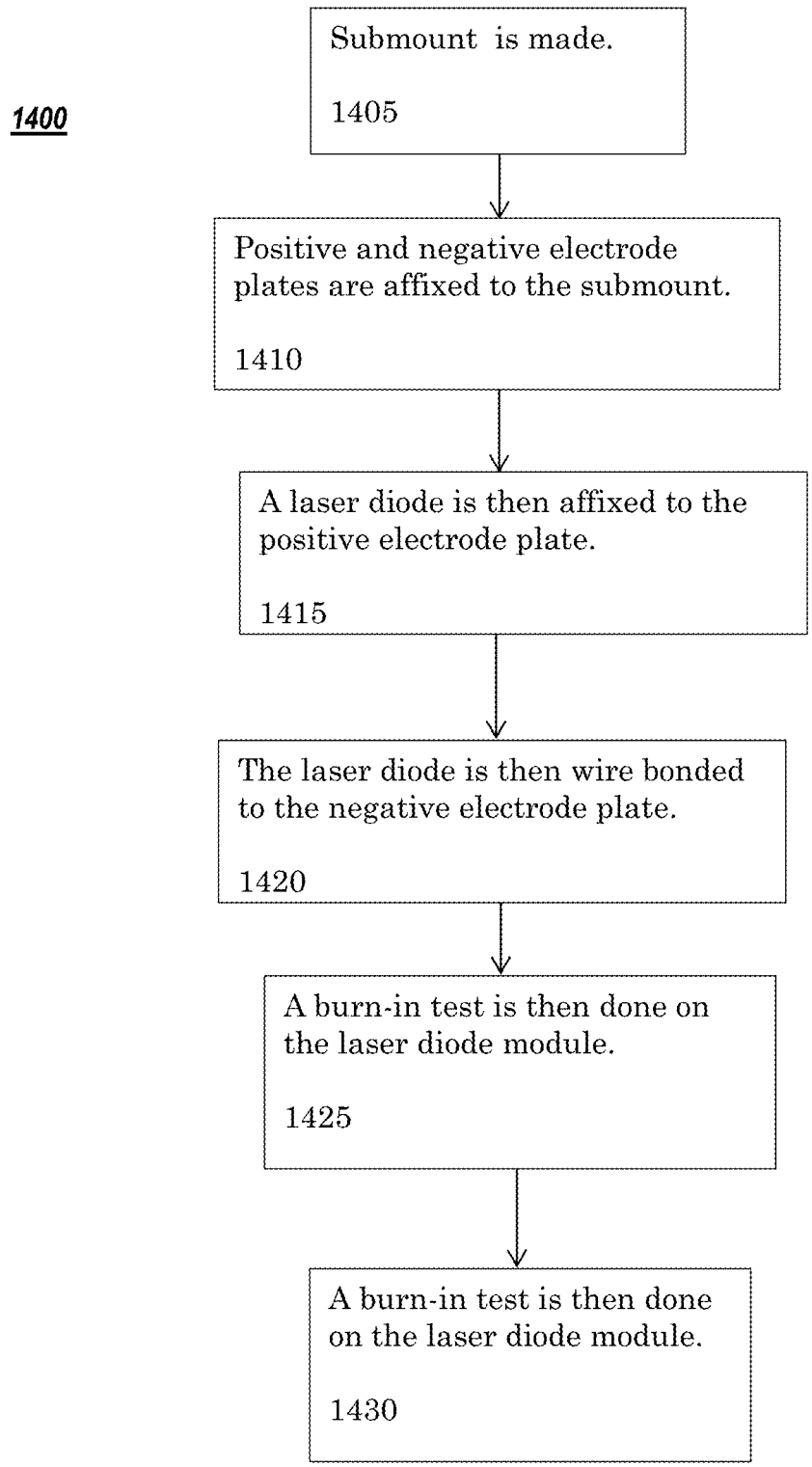
FIG. 14 is an example flowchart for making a laser diode module in accordance with another embodiment

FIG. 14 shows an example top level flow chart for making a laser diode module according to embodiment of the invention. A CoS module may be provided (1405). Positive and negative electrode plates may be affixed to the submount using techniques known to one of ordinary skill in the art to make a plated submount (1410). The positive side (bottom) of a laser diode may then be affixed to the positive electrode plate of the plated submount using solder or conductive epoxy (1415). The negative side (top) of the laser diode may be wire bonded to the negative electrode plate of the plated submount (1420). This results in the CoS module, e.g. laser diode module. A burn-in test may be then done on the CoS, e.g. laser diode module (1425). The CoS, e.g. laser diode module, may then be affixed to a chassis, for example, such as a laser projection module (1430).

Although embodiments described herein describe the laser diode affixed to the positive electrode plate and wire bonded to the negative electrode plate, other embodiments may have laser diode affixed to the negative electrode plate and wire bonded to the positive electrode plate, for example.

Although the embodiments described herein describe a laser diode affixed to an electrode for purposes of illustration, other embodiments may have other optical or electro-optical components affixed to the electrode.

In general, a laser diode module includes a submount having a top surface, a bottom surface and a plurality of side surfaces. A positive electrode plate is affixed to a first portion of one side surface, the top surface and a first portion of the bottom surface, where the positive electrode plated first portion of the one side surface and the positive electrode plated top surface are interconnected. A connector is configured to electrically connect the positive electrode plated top surface to the positive electrode plated first portion of the bottom surface. A negative electrode plate affixed to a second portion of the one side surface and a second portion of the bottom surface, where the negative electrode plated second portion of the one side surface and the negative electrode plated second portion of the bottom surface are interconnected. A laser diode affixed to the positive electrode plated first portion of the one side surface and connected to the negative electrode plated second portion of the one side surface. In an embodiment, the connector is a positive electrode plated second side surface. In another embodiment, the connector is a via. In an embodiment, laser diode module includes a thermal pad on a third portion of the bottom surface. In an embodiment, the laser diode is connected to the negative electrode plated second portion of the one side surface via wirebonding.

In general, a device includes a submount having a top surface, a bottom surface and a plurality of side surfaces. The device further includes a positive electrode including a plated first portion of a first side surface and a plated first portion of the bottom surface. The device further includes a connector configured to electrically connect the plated first portion of a first side surface and the plated first portion of the bottom surface. The device further includes a negative electrode including a plated second portion of the first side surface and a plated second portion of the bottom surface. The device further includes a laser diode affixed to the plated first portion of the one side surface and connected to the plated second portion of the one side surface. In an embodiment, the positive electrode further includes a plated top surface connected to the plated first portion of a first side surface and where the connector is a plated second side surface. In an embodiment, the connector is a via. In an embodiment, the connector is a plated top surface connected to the plated first portion of a first side surface, and a via connecting the plated top surface to the plated first portion of the bottom surface. In an embodiment, the connector is a plated second side surface. In an embodiment, the connector is a plated third portion of the first side surface. In an embodiment, the device further comprises a thermal pad on a third portion of the bottom surface. In an embodiment, the laser diode is connected to the plated second portion of the first side surface via wirebonding. In an embodiment, the negative electrode further includes a plated second top surface connected to the plated second portion of the first side surface, and a plated fourth side surface connected to the plated second portion of the bottom surface.

In general, a method for making a laser diode module comprises providing a submount with a top surface, a bottom surface and a plurality of side surfaces; affixing a first electrode plate to a first portion of one side surface, the top surface and a first portion of the bottom surface; connecting with a connector the first electrode plated top surface to the first electrode plated first portion of the bottom surface; affixing a second electrode plate to a second portion of the one side surface and a second portion of the bottom surface; affixing an optical component to the first electrode plated first portion of the one side surface; and connecting the optical component to the second electrode plated second portion of the one side surface, where the first electrode plate has one polarity and the second electrode plate has another polarity. In an embodiment, the connector is a first electrode plated second side surface. In an embodiment, the connector is a via. In an embodiment, the method further includes affixing a thermal pad on a third portion of the bottom surface. In an embodiment, the optical component is connected to the second electrode plated second portion of the one side surface via wirebonding. In an embodiment, the optical component is a laser diode.

The methods provided, to the extent applicable, may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein, to the extent applicable, may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

It is to be understood that the present invention is not limited to the embodiments described above, but encompasses any and all embodiments within the scope of the following claims. Additionally, although the features and elements of the present application are described in the example embodiments in particular combinations, each feature or element can be used alone (without the other features and elements of the example embodiments) or in various combinations with or without other features and elements of the present application.

What is claimed is:

1. A laser diode module, comprising:
   a submount having a first top surface, a second top surface, a bottom surface and a plurality of side surfaces including a first side surface, a second side surface, and a third side surface, wherein the first top surface overlays a first portion of the bottom surface without overlaying a second portion of the bottom surface and is offset from the bottom surface by a first thickness and wherein the second top surface overlays the second portion of the bottom surface without overlaying the first portion of the bottom surface and is offset from the bottom surface by a second thickness that is less than the first thickness;
   a first positive electrode plate mounted to a first portion of the first side surface, wherein the first side surface is substantially orthogonal to the first top surface, the second top surface, the second side surface, and the bottom surface;
   a second positive electrode plate mounted to the second side surface, wherein the second side surface is substantially orthogonal to the first top surface, the second top surface, the bottom surface and the first side surface;
   a third positive electrode plate mounted only to the first portion of the bottom surface, wherein the first positive electrode plate, the second positive electrode plate, and the third positive electrode plate are interconnected electrically;
   a first negative electrode plate mounted to a second portion of the first side surface;
   a second negative electrode plate mounted to the second top surface;
   a third negative electrode plate mounted to the third side surface, wherein the third side surface is substantially parallel to first side surface;
   a fourth negative electrode plate mounted to only the second portion of the bottom surface, wherein the first negative electrode plate, the second negative electrode plate, the third negative electrode plate, and the fourth electrode plate are interconnected electrically; and
   a laser diode mounted to the first positive electrode plate on the first side surface and connected to the first negative electrode plate on the first side surface.

2. The laser diode module of claim 1, wherein the first portion of the first side surface and the second portion of the first side surface are in a same plane.

3. The laser diode module of claim 2, wherein the laser diode is configured to emit in a direction orthogonal to the first top surface and the bottom surface.

4. The laser diode module of claim 3, wherein the laser diode is configured to emit in a plane parallel to the first portion of the first side surface.

5. The laser diode module of claim 4, wherein the laser diode is connected to the plated second portion of the first side surface via wirebonding.

6. The laser diode module of claim 1, further comprising:
   a thermal pad on a third portion of the bottom surface.

7. The laser diode module of claim 6, wherein the thermal pad is a portion of a leadframe.

8. A device, comprising:
   a submount having a first top surface, a second top surface, a bottom surface and a plurality of side surfaces including a first side surface, a second side surface, and a third side surface, wherein the first top surface overlays a first portion of the bottom surface absent overlaying a second portion of the bottom surface and is offset from the bottom surface by a first thickness and wherein the second top surface overlays the second portion of the bottom surface absent overlaying the first portion of the bottom surface and is offset from the bottom surface by a second thickness that is less than the first thickness;
- a first conductive film covering a first portion of the first side surface, wherein the first side surface is substantially orthogonal to the first top surface, the second top surface, and the bottom surface;
- a second conductive film covering the second side surface, wherein the second side surface is substantially orthogonal to the first top surface, the second top surface, the bottom surface and the first side surface;
- a third conductive film covering only the first portion of the bottom surface, wherein the first conductive film, the second conductive film, and the third conductive film have a first polarity and are interconnected electrically:
- a fourth conductive film covering a second portion of the first side surface;
- a fifth conductive film covering the second top surface;
- a sixth conductive film covering the third side surface, wherein the third side surface is substantially parallel to first side surface;
- a seventh conductive film covering only the second portion of the bottom surface, wherein the fourth conductive film, the fifth conductive film, the sixth conductive film and the seventh conductive film have a second polarity and are interconnected electrically; and
- a laser diode mounted to the first conductive film on the first side surface and connected to the fourth conductive film on the first side surface.

9. The laser diode module of claim 8, wherein the first portion of the first side surface and the second portion of the first side surface are in a same plane.

10. The laser diode module of claim 9, wherein the laser diode is configured to emit in a direction orthogonal to the first top surface and the bottom surface.

11. The laser diode module of claim 10, wherein the laser diode is configured to emit in a plane parallel to the first portion of the first side surface.

12. The laser diode module of claim 11, wherein the laser diode is connected to the fifth conductive film via wirebonding.

13. The laser diode module of claim 12, further comprising:
- a thermal pad on a third portion of the bottom surface.

14. The laser diode module of claim 13, wherein the thermal pad is a portion of a leadframe.

15. A method for making a chip on submount module, the method comprising:
- providing a submount with a first top surface, a second top surface, a bottom surface, and a plurality of side surfaces including a first side surface, and a second side surface and a third side surface, wherein the first top surface overlays only a first portion of the bottom surface and is offset from the bottom surface by a first thickness and wherein the second top surface overlays only a second portion of the bottom surface and is offset from the bottom surface by a second thickness that is less than the first thickness;
- forming a first electrode plate on a first portion of the first side surface, wherein the first side surface is substantially orthogonal to the first top surface, the second top surface, and the bottom surface;
- forming a second electrode plate on the second side surface wherein the second side surface is substantially orthogonal to the first top surface, the second top surface, the bottom surface, and the first side surface;
- forming a third electrode plate on only the first portion of the bottom surface, wherein the first electrode plate, the second electrode plate, and the third electrode plate have one polarity and are interconnected electrically;
- forming a fourth electrode plate on a second portion of the first side surface;
- forming a fifth electrode plate on the second top surface;
- forming a sixth electrode plate on the third side surface, wherein the third side surface is substantially parallel to first side surface;
- forming a seventh electrode plate on only the second portion of the bottom surface, wherein the fourth electrode plate, the fifth negative electrode plate, the sixth negative electrode plate and the seventh electrode plate have an opposite polarity and are interconnected electrically;
- mounting an optical component to the first electrode plate on the first side surface; and
- connecting the optical component to the fourth electrode plate on the first side surface.

16. The method of claim 15, wherein the first portion of the first side surface and the second portion of the first side surface are in a same plane.

17. The method of claim 15, wherein the optical component is a laser diode and the laser diode is configured to emit in a direction orthogonal to the first top surface and the bottom surface and to emit in a plane parallel to the first side surface.

* * * * *